(12) United States Patent
Tung

(10) Patent No.: US 9,971,250 B2
(45) Date of Patent: May 15, 2018

(54) METHOD OF DECOMPOSING LAYOUT DESIGN FOR PREPARING PHOTOMASK SET PRINTED ONTO WAFER BY PHOTOLITHOGRAPHY, METHOD OF FORMING PHOTOMASK SET AND METHOD OF FABRICATING INTEGRATED CIRCUIT

(71) Applicant: UNITED MICROELECTRONICS CORP., Hsin-Chu (TW)

(72) Inventor: Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 700 days.

(21) Appl. No.: 14/534,190

(22) Filed: Nov. 6, 2014

(65) Prior Publication Data
US 2016/0132626 A1    May 12, 2016

(51) Int. Cl.
*G06F 17/50* (2006.01)
*G03F 7/20* (2006.01)
*G03F 1/70* (2012.01)

(52) U.S. Cl.
CPC ............ *G03F 7/70466* (2013.01); *G03F 1/70* (2013.01)

(58) Field of Classification Search
USPC ......................................................... 716/54
See application file for complete search history.

(56) References Cited

U.S. PATENT DOCUMENTS

| 2009/0199137 A1* | 8/2009 | Huckabay | ........... G06F 17/5068 716/136 |
| 2012/0302059 A1 | 11/2012 | Aton | |
| 2015/0011022 A1* | 1/2015 | Lee | ..................... G03F 7/70466 438/5 |

* cited by examiner

Primary Examiner — Eric Lee
(74) Attorney, Agent, or Firm — Winston Hsu

(57) ABSTRACT

A method of decomposing layout design for preparing a photomask set printed onto a wafer by photolithography includes the following steps. An integrated circuit layout design including several features is obtained. The overlay relation of these features is recognized to classify these features into a first group and a second group. These features printed onto different layers of the wafer are distinguished to decompose the first group into a first feature and a third feature, and the second group into a second feature and a fourth feature. The first feature is outputted to a first photomask, the second feature is outputted to a second photomask, a third feature is outputted to a third photomask and a fourth feature is outputted to a fourth photomask. A method of forming a photomask set and a method of fabricating an integrated circuit are also provided.

15 Claims, 9 Drawing Sheets

METHOD OF DECOMPOSING LAYOUT DESIGN FOR PREPARING PHOTOMASK SET PRINTED ONTO WAFER BY PHOTOLITHOGRAPHY, METHOD OF FORMING PHOTOMASK SET AND METHOD OF FABRICATING INTEGRATED CIRCUIT

BACKGROUND OF THE INVENTION

1. Field of the Invention

The present invention relates generally to methods of decomposing layout design for preparing a photomask set printed onto a wafer by photolithography, forming a photomask set, and fabricating an integrated circuit, and more specifically to the above methods that decompose a layout design to form a photomask set, and then align the overlapping photomasks.

2. Description of the Prior Art

An integrated circuit (IC) is a device, such as a semiconductor device, or an electronic system that includes many electronic components, such as transistors, resistors and diodes. These components are often interconnected to form multiple circuit components, e.g. gates, cells, memory units, arithmetic units, controllers and decoders. An IC includes multiple layers of wiring that interconnects the electronic and circuit components. Design engineers design ICs by transforming logical or circuit descriptions of the components into geometric descriptions, which are called design layouts.

Fabrication foundries (fabs) manufacture ICs based on the design layouts using a photolithographic process. Photolithography is an optical printing and fabrication process by which patterns on a photolithographic mask (i.e. a photomask) are imaged and defined onto a photosensitive layer coating a substrate. To fabricate an IC, photomasks are created using the IC design layout as a template. The photomasks contain the various geometries (features) of the IC design layout. The various geometries contained on the photomasks correspond to the various base physical IC elements that comprise functional circuit components such as transistors, interconnect wiring and via pads, as well as other elements that are not functional circuit elements, but are used to facilitate, enhance or track various manufacturing processes. Through sequential use of the various photomasks corresponding to a given IC in an IC fabrication process, a large number of material layers of various shapes and thicknesses with different conductive and insulating properties may be built up to form the overall IC and the circuits within the IC design layout.

Constraining factors in traditional photolithographic processes limit their effectiveness as circuit complexity continues to increase and transistor designs become more advanced and ever smaller in size. Some constraining factors are the lights/optics used within the photolithographic processing systems. Specifically, the lights/optics are band limited due to physical limitations (e.g. wavelength and aperture) of the photolithographic process. The photolithographic process therefore cannot print beyond a certain pitch and distance, and also suffers from other physical manufacturing constraints.

A pitch specifies a sum of the width of a feature and the space on a side of the feature separating the feature from a neighboring feature. Depending on the photolithographic process, factors such as optics and wavelengths of light or radiation restrict how small the pitch may be made before features can no longer be reliably printed to a wafer or mask. The smallest size of any feature that can be created on a wafer is severely limited by the pitch.

With the advance of ultra-deep submicron technology, the feature size and feature pitch become so small that existing lithography processes meet a bottleneck in printing the shapes represented by the features. There are also difficulties in the practical use of advanced photolithographic processes, such as extreme ultra violet (EUV). Current lithography technology is expected to be used for next generation silicon technology. To compensate for the difficulty in printing the shape of small pitches, multiple patterning lithography is recognized as a promising solution for 32 nm, 22 nm and sub-22 nm volume IC production. Multiple patterning lithography technology decomposes a single layer of a layout into multiple masks and applies multiple exposures to print the shapes in the layer. The decomposition provided by multiple patterning lithography increases shape printing pitch and improves the focus depth.

SUMMARY OF THE INVENTION

The present invention provides a method of decomposing layout design for preparing a photomask set printed onto a wafer by photolithography, a method of forming a photomask set and a method of fabricating an integrated circuit, wherein the methods decompose a layout design to form a photomask set and then aligning the photomasks according to their overlay relation.

The method of decomposing layout design for preparing a photomask set printed onto a wafer by photolithography includes the following steps. An integrated circuit layout design including several features is obtained. The overlay relation of these features is recognized so they can be classified into a first group and a second group by a computer system. These features printed onto different layers of the wafer are then distinguished to decompose the first group into a first feature and a third feature, and the second group into a second feature and a fourth feature. The first feature is outputted to a first photomask, the second feature is outputted to a second photomask, a third feature is outputted to a third photomask and a fourth feature is outputted to a fourth photomask.

The method of forming a photomask set includes the following steps. A first photomask including a first feature and a second photomask including a second feature are provided, wherein the first feature and the second feature are printed in a same layer of a wafer. A third photomask including a third feature and a fourth photomask including a fourth feature are provided, wherein the third feature and the fourth feature are printed in a same layer of the wafer, and the third feature overlaps the first feature and the fourth feature overlaps the second feature.

The method of fabricating an integrated circuit includes the following steps. A first photomask is used to form a first pattern and a second photomask is used to form a second pattern, wherein the first pattern and the second pattern are in a same layer. A third photomask is aligned to the first pattern to form a third pattern overlapping the first pattern. A fourth photomask is aligned to the second pattern to form a four pattern overlapping the second pattern, wherein the third pattern and the fourth pattern are in a same layer.

The present invention provides a method of decomposing layout design for preparing a photomask set printed onto a wafer by photolithography, a method of forming a photomask set and a method of fabricating an integrated circuit, wherein a layout design is decomposed according to the overlay relation and printed layers of these features included in the layout design, so that the features can be classified into a first feature, a second feature, a third feature and a fourth feature. A photomask set constituted by a first photomask including the first feature, a second photomask including the second feature, a third photomask including the third feature and a fourth photomask including the fourth feature can thereby be formed.

By applying the photomask set, the first pattern exposed by the first photomask and the second pattern exposed by the second photomask can be formed accurately in a same layer. The scale of the first pattern and the second pattern can be reduced due to looser pitches by exposing the first photomask and the second photomask, respectively. The third pattern exposed by the third photomask can overlap the first pattern perfectly as it is only aligned to the first pattern while the fourth pattern exposed by the fourth photomask can overlap the second pattern perfectly as it is only aligned to the second pattern.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
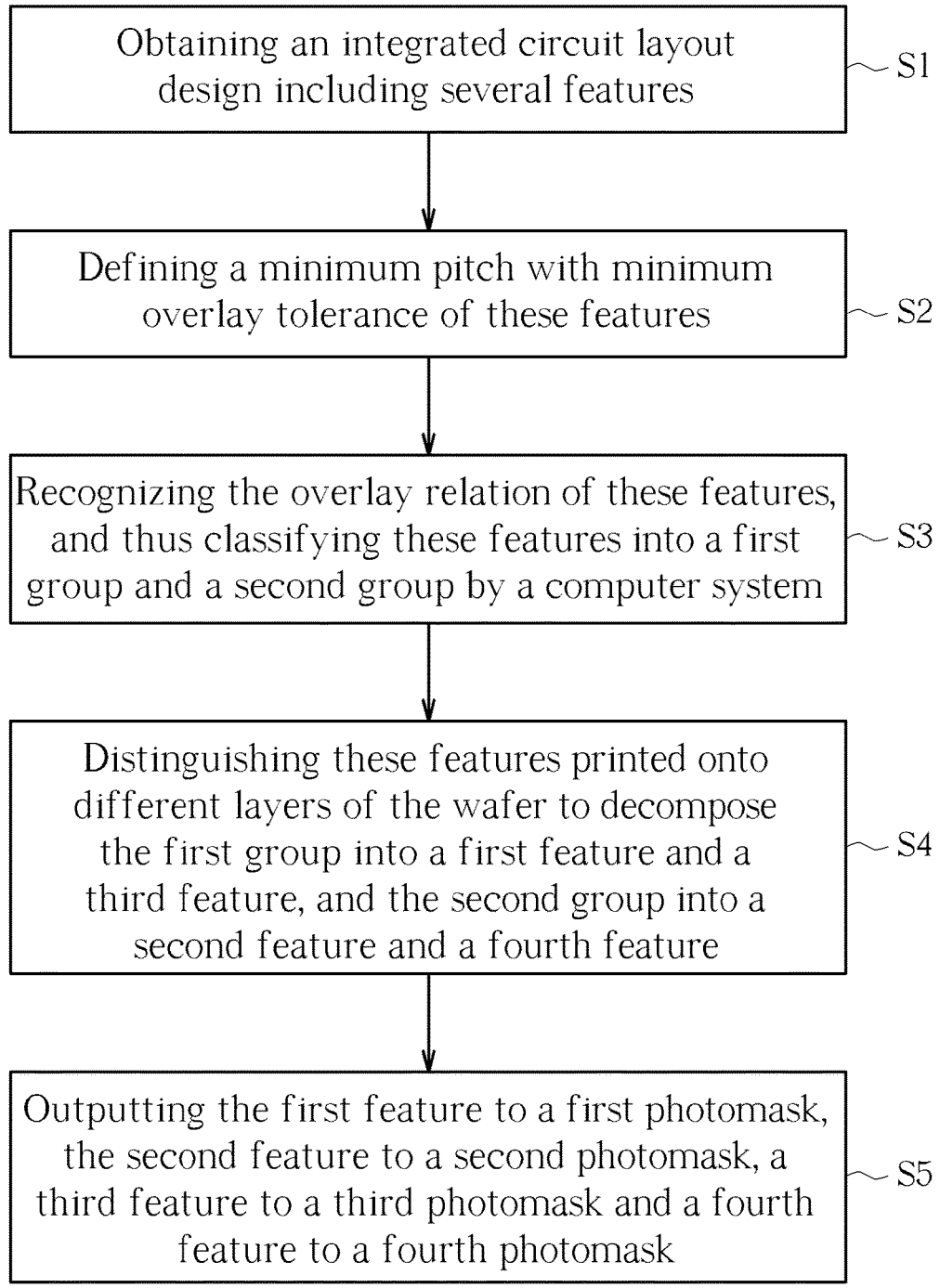
FIG. 1 schematically depicts a flow chart of a method of decomposing layout design for preparing a photomask set printed onto a wafer by photolithography according to an embodiment of the present invention.

FIG. 1 schematically depicts a flow chart of a method of decomposing layout design for preparing a photomask set printed onto a wafer by photolithography according to an embodiment of the present invention. FIGS. 2-6 schematically depict top views of a method of decomposing layout design for preparing a photomask set printed onto a wafer by photolithography according to the embodiment shown in FIG. 1. Preferably, dense parts of an integrated circuit layout design may first be selected or marked. The following steps of the present invention may only be performed on these dense parts instead of being performed on all the integrated circuit layout design, in order to save processing time and processing cost.

Figure 2:
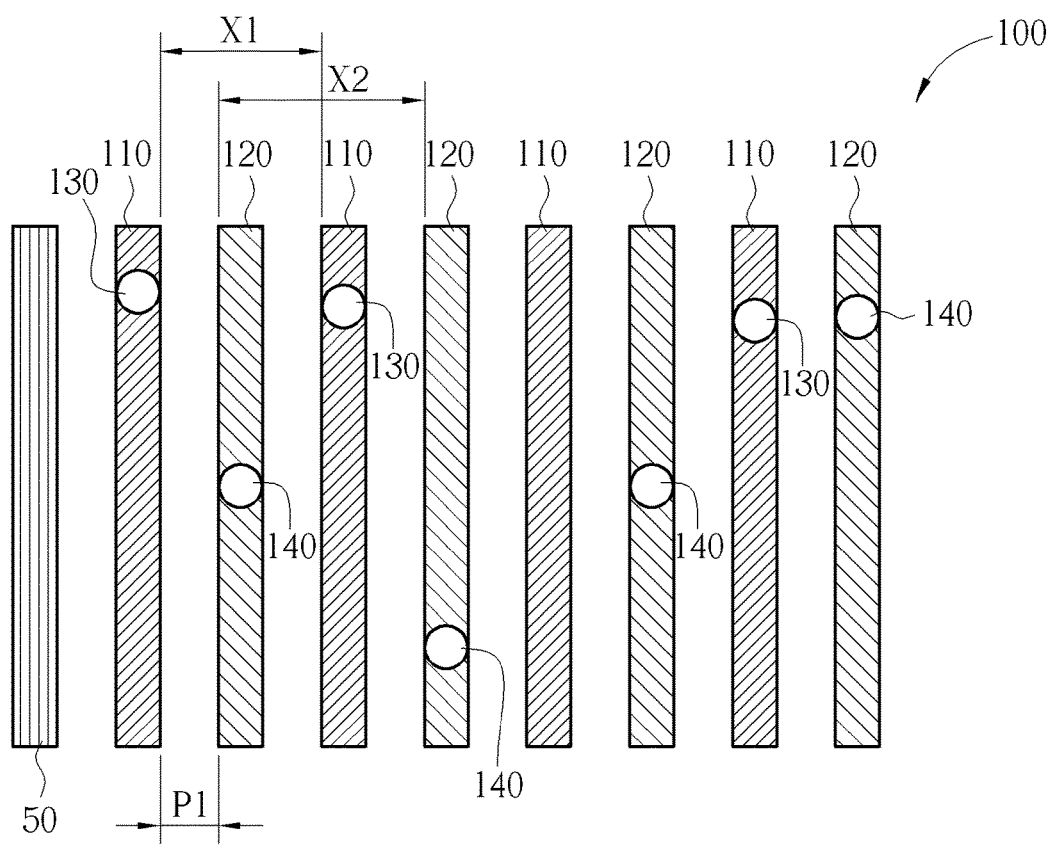
FIGS. 2-6 schematically depict top views of a method of decomposing layout design for preparing a photomask set printed onto a wafer by photolithography according to the embodiment shown in FIG. 1.

Please refer to FIGS. 1-6, according to Step S1 of FIG. 1—obtaining an integrated circuit layout design including several features, an integrated circuit layout design 100 shown in FIG. 2 is obtained, wherein the integrated circuit layout design 100 may include several features 110/120/130/140, depending upon practical requirements. In this embodiment, the features 110/120/130/140 may include a first feature 110, a second feature 120, a third feature 130 and a fourth feature 140. It is noted that the features 110/120/130/140 are not actually divided or classified into the first feature 110, the second feature 120, the third feature 130 and the fourth feature 140 in this step, and should be seen as one single pattern. The first feature 110, the second feature 120, the third feature 130 and the fourth feature 140 are presented herein for illustrating their geometric relations and designing purposes. Moreover, the integrated circuit layout design 100 may further include a fifth feature 50, which does not overlap the third feature 130 and the fourth feature 140.

In this embodiment, the first feature 110 and the second feature 120 printed to a wafer (not shown) are interconnect patterns and the third feature 130 and the fourth feature 140 printed to the wafer are via patterns, but are not limited thereto. In addition, the first feature 110 and the second feature 120 printed to a wafer (not shown) may be via patterns and the third feature 130 and the fourth feature 140 printed to the wafer are interconnect patterns. In another embodiment, the first feature 110 and the second feature 120 printed to a wafer may be polysilicon gate patterns; thus, the third feature 130 and the fourth feature 140 printed to the wafer may be contact patterns, depending upon practical requirements. Furthermore, the fifth feature 50 printed to the wafer may be a pattern such as an interconnect pattern, a via pattern or a polysilicon gate pattern, similar to the first feature 110 and the second feature 120, or may be any kinds of patterns. More precisely, the first feature 110 and the second feature 120 are printed in a same layer of the wafer while the third feature 130 and the fourth feature 140 may be printed in different layers of the first feature 110 and the second feature 120. In this embodiment, the fifth feature 50 is printed in the same layer as the first feature 110 and the second feature 120, but it is not limited thereto. The third feature 130 and the fourth feature 140 must overlap the first feature 110 and the second feature 120, but do not overlap the fifth feature 50. In this case, the third feature 130 only overlaps the first feature 110 while the fourth feature 140 only overlaps the second feature 120, and the first feature 110 does not overlay the second feature 120. In a preferred case, the whole third feature 130 overlaps the first feature 110 while the whole fourth feature 140 overlaps the second feature 120, but is not limited thereto. In this embodiment, the first feature 110 is parallel to the second feature 120, and the first feature 110 and the second feature 120 are arranged alternately. The pitch x1 between lines of the first feature 110 and the pitch x2 between lines of the second feature 120 are regular and uniform. The minimum pitch of these pitches x1/x2 can be larger than any other ways of classifying these features 110/120/130/140. Therefore, a same pitch P1 is between each line of the first feature 110 and the second feature 120.

According to Step S2 of FIG. 1—defining a minimum pitch with minimum overlay tolerance of these features, a minimum pitch with minimum overlay tolerance of these features 110/120/130/140 may be optionally defined.

Figure 3:
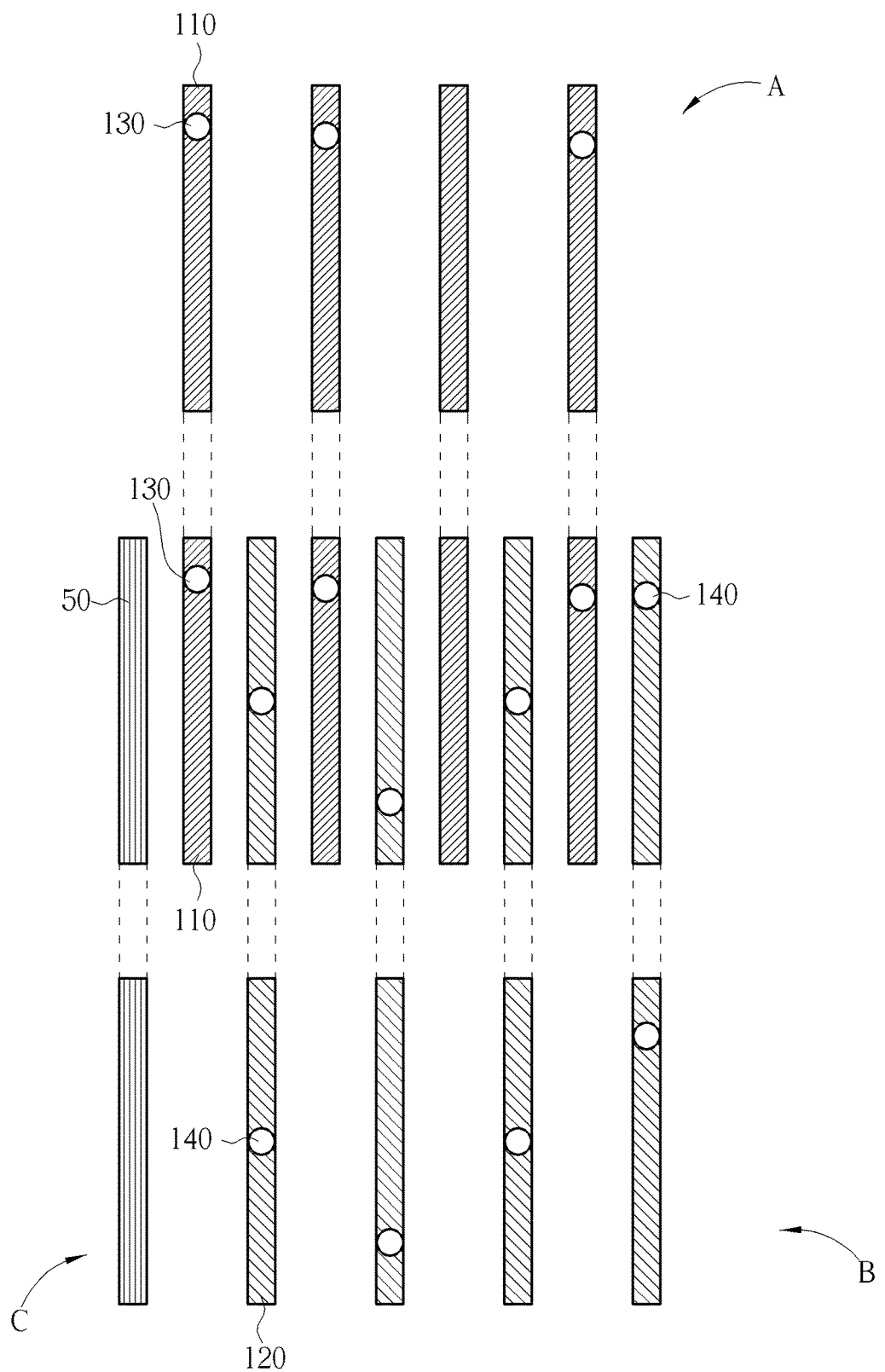

According to Step S3 of FIG. 1—recognizing the overlay relation of these features, and thus classifying these features into a first group and a second group by a computer system. As the third feature 130 overlaps the first feature 110 and the fourth feature 140 overlaps the second feature 120, the features 110/120/130/140 are classified into a first group A and a second group B, wherein the first group A includes the first feature 110 and the third feature 130 while the second group B includes the second feature 120 and the fourth feature 140 in this embodiment as shown in FIG. 3. In another embodiment, the third feature 130 may not only overlap the first feature 110 and the fourth feature 140 may not only overlap the second feature 120; or the third feature 130 may overlap both the first feature 110 and the second feature 120 and the fourth feature 140 may overlap both the first feature 110 and the second feature 120. A way to classify these features 110/120/130/140 may depend upon the tolerance of the third feature 130 overlapping the first feature 110 and the second feature 120 and the tolerance of the fourth feature 140 overlapping the first feature 110 and the second feature 120. For instance, as the tolerance of the third feature 130 overlapping the first feature 110 is smaller than the tolerance of the third feature 130 overlapping the second feature 120, and the tolerance of the fourth feature 140 overlapping the second feature 120 is smaller than the tolerance of the fourth feature 140 overlapping the first feature 110, the third feature 130 and the first feature 110 should be classified into one same group while the fourth feature 140 and the second feature 120 should be classified into another same group. To sum up, the features 110/120/130/140 classified into one same group must overlap each other, or the features 110/120/130/140 classified into one same group must have a sufficient overlay in relation to each other. Furthermore, the fifth feature 50 is classified into a third group C, which does not overlap these features 110/120/130/140.

Figure 4:
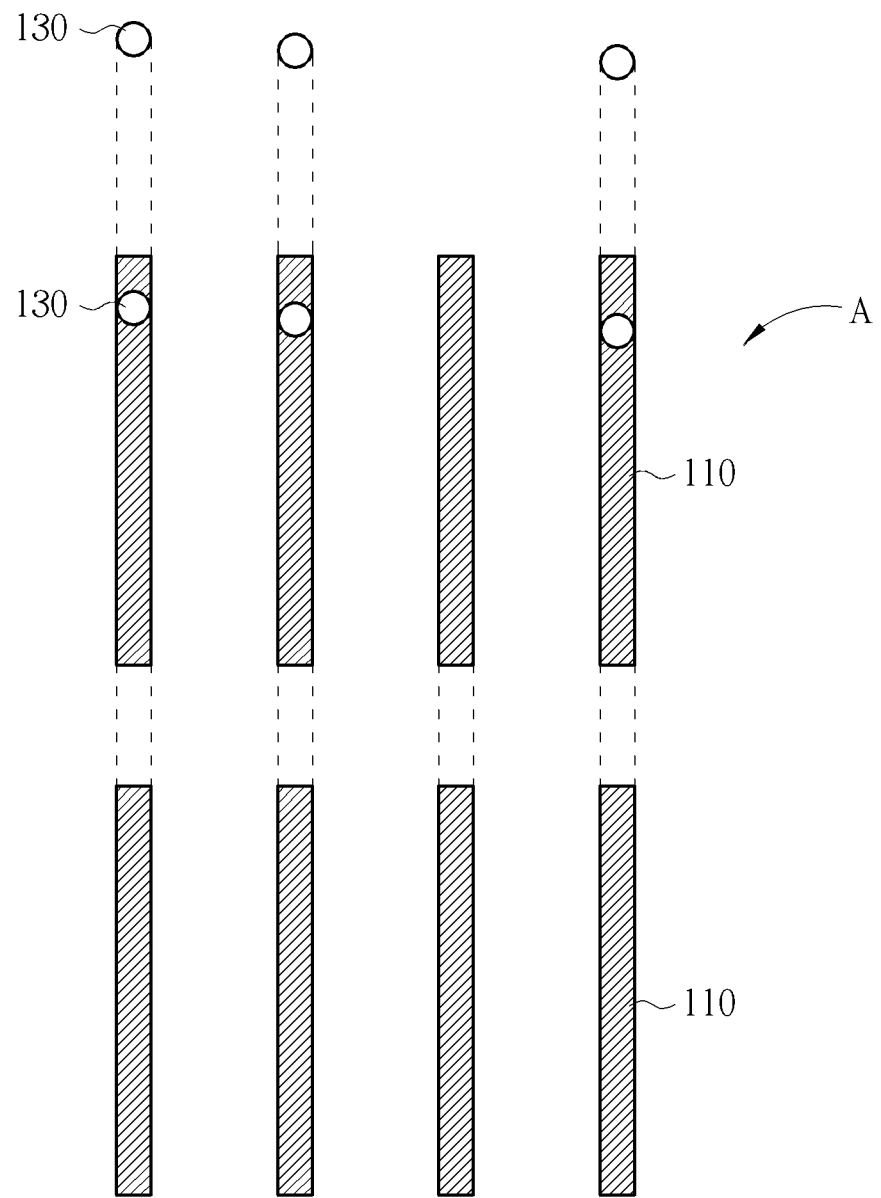
Figure 5:
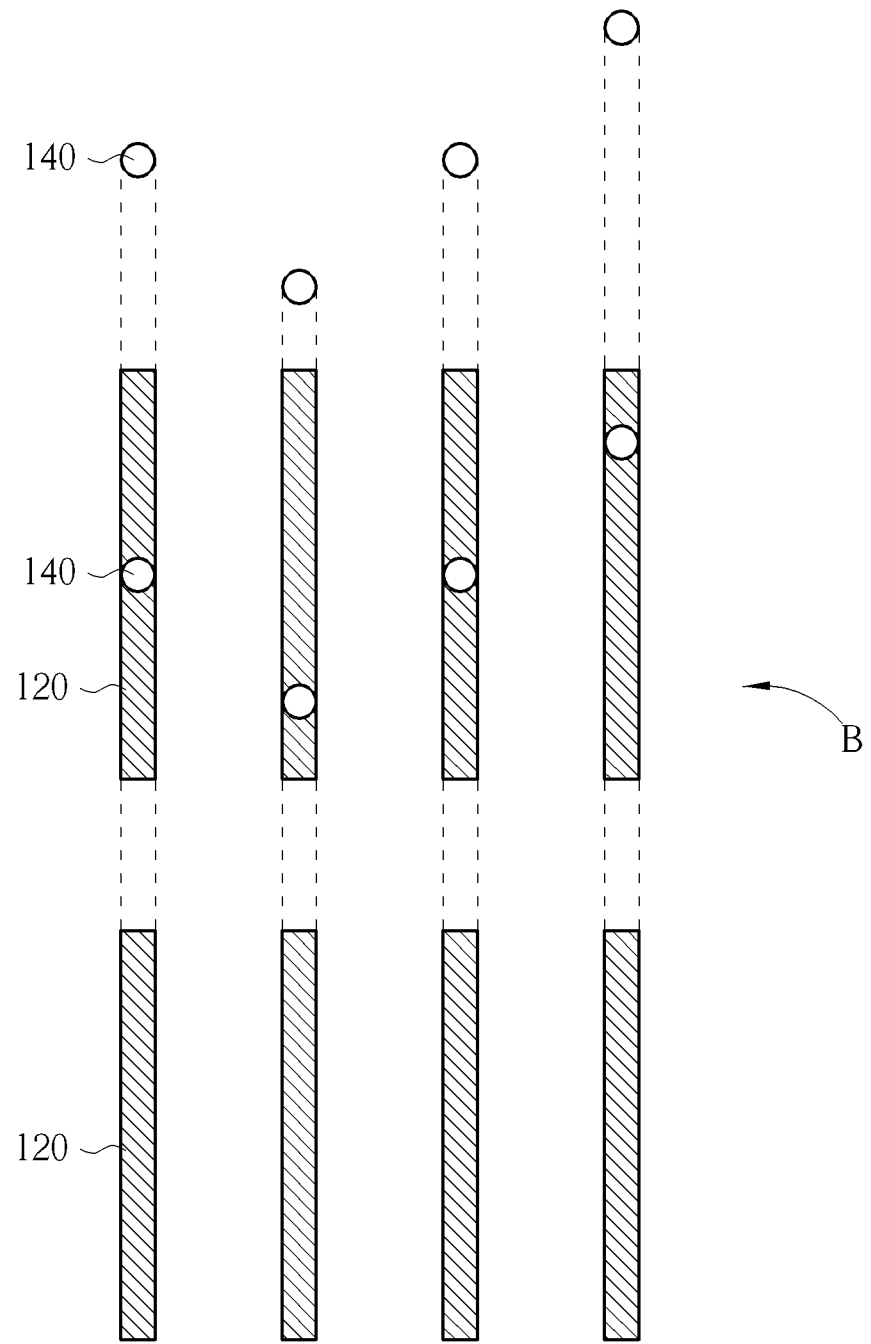

According to Step S4 of FIG. 1—distinguishing these features printed onto different layers of the wafer to decompose the first group into a first feature and a third feature, and the second group into a second feature and a fourth feature (by a computer system), the first feature 110 and the third feature 130 included in the first group A are decomposed as shown in FIG. 4 while the second feature 120 and the fourth feature 140 included in the second group B are decomposed as shown in FIG. 5. In detail, since the first feature 110 and the second feature 120 are printed on the wafer as interconnect patterns in one same layer while the third feature 130 printed on the wafer as via patterns in one same layer, and the third feature 130 and the fourth feature 140 are not at the same layer as the first feature 110 and the second feature 120, or the first feature 110 and the third feature 130 are printed in different layers of the wafer while the second feature 120 and the fourth feature 140 are printed in different layers of the wafer, the first group A is decomposed into the first feature 110 and the third feature 130 while the second group B is decomposed into the second feature 120 and the fourth feature 140.

Figure 6:
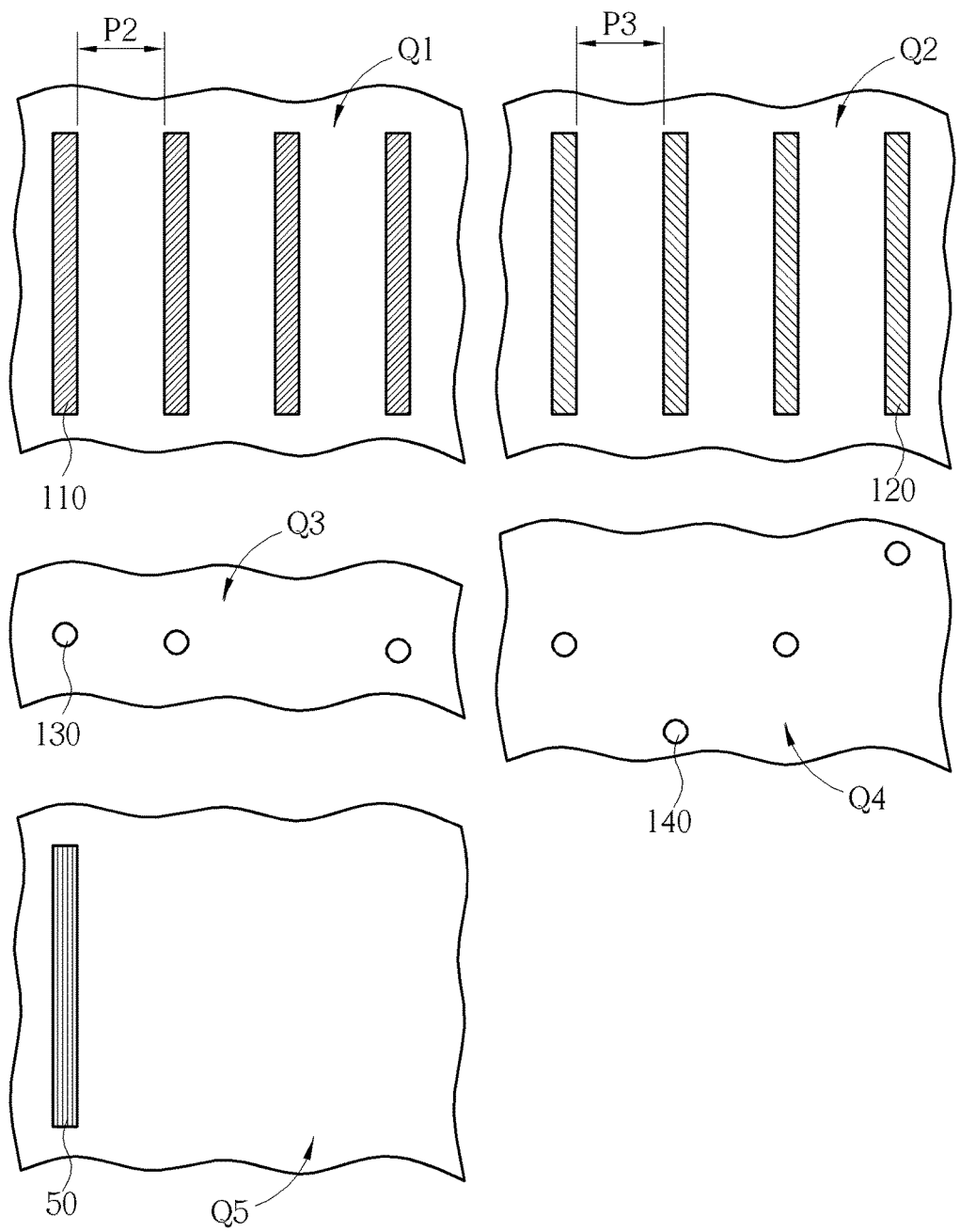

According to Step S5 of FIG. 1—outputting the first feature to a first photomask, the second feature to a second photomask, a third feature to a third photomask and a fourth feature to a fourth photomask, the first feature 110 is output and a first photomask Q1 is formed; the second feature 120 is output and a second photomask Q2 is formed; the third feature 130 is output and a third photomask Q3 is formed; and the fourth feature 140 is output and a fourth photomask Q4 is formed, as shown in FIG. 6. Furthermore, the fifth feature 50 is also output and a fifth photomask Q5 is formed.

Above all, the integrated circuit layout design 100 is decomposed into fifth parts according to the overlay relations and printed layers in a wafer of the features 110/120/130/140/50 included in the integrated circuit layout design 100. By decomposing the integrated circuit layout design 100 into the first photomask Q1 including the first feature 110, the second photomask Q2 including the second feature 120, the third photomask Q3 including the third feature 130, the fourth photomask Q4 including the fourth feature 140 and the fifth photomask Q5 including the fifth feature 50, many objectives can be achieved, such as reducing the scale of a printed integrated circuit and improving the overlay accuracy of the features 110/120/130/140 printed in the integrated circuit.

Figure 7:
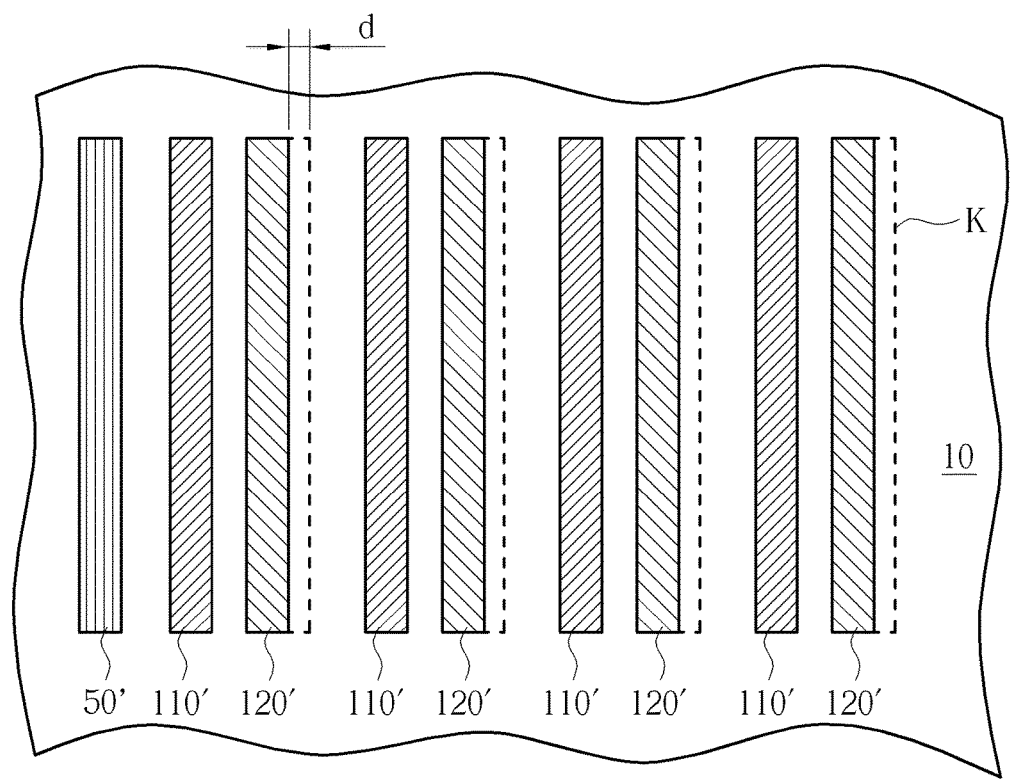
FIGS. 7-9 schematically depicts top views of a method of fabricating an integrated circuit by the photomask set of FIG. 6.
Figure 8:
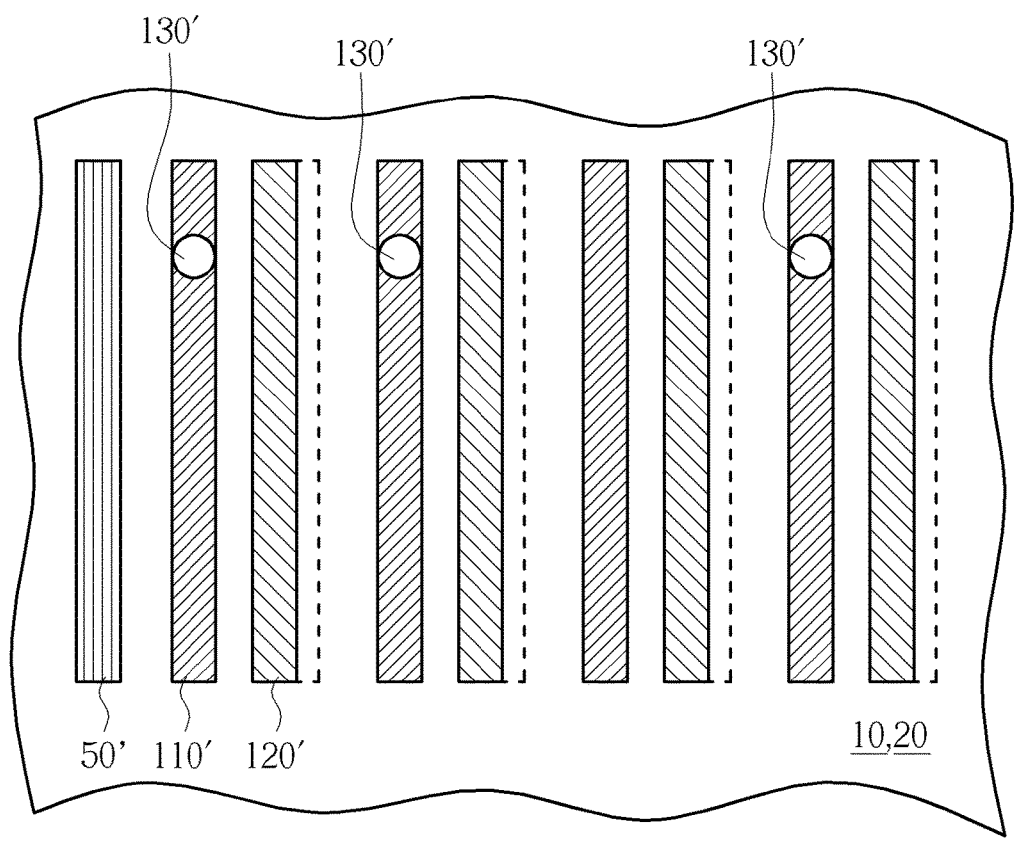
Figure 9:
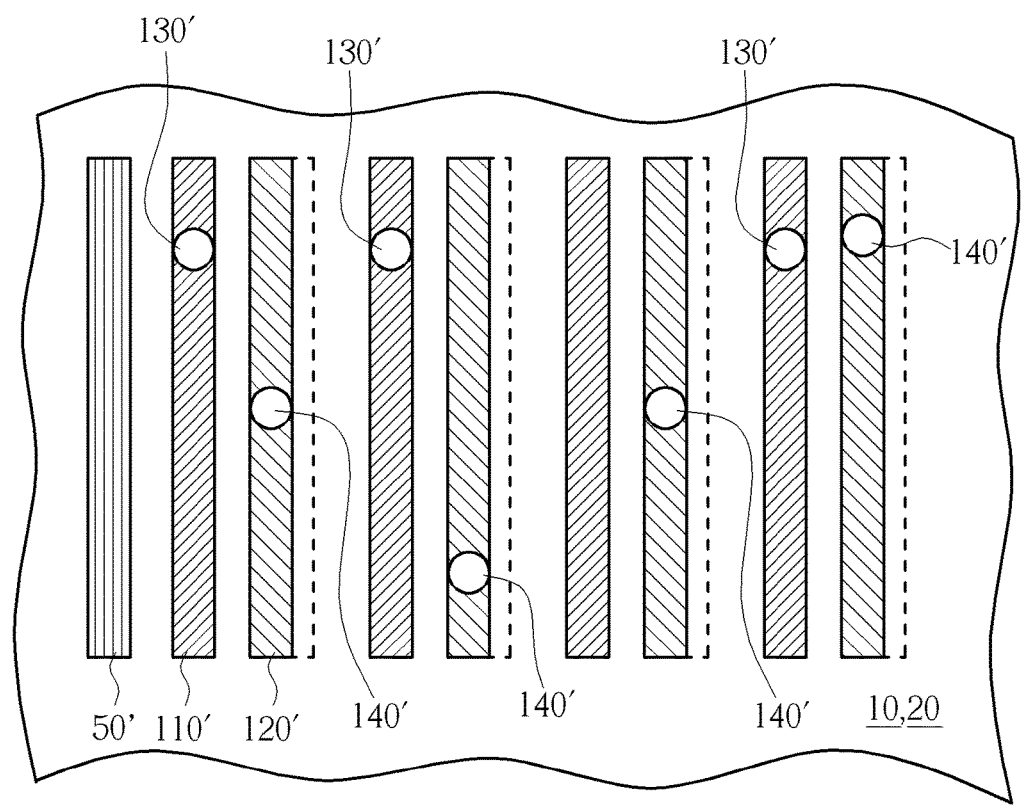

A way of applying the integrated circuit layout design 100, which decomposes into a photomask set including the first photomask Q1, the second photomask Q2, the third photomask Q3, the fourth photomask Q4 and the fifth photomask Q5, is presented in the following. FIG. 7-9 schematically depicts top views of a method of fabricating an integrated circuit by the photomask set of FIG. 6.

As shown in FIGS. 6-7, the first photomask Q1 is used to form a first pattern 110' transferred from the first feature 110 in a layer 10. Then, the second photomask Q2 is used to form a second pattern 120' transferred from the second feature 120 in the same layer 10. The first pattern 110' and the second pattern 120' can be formed by applying double-patterning technology, which involves decomposing the layout of a given layer of an integrated circuit design into two separate sub-layers, each of which is associated with a different pattern mask. The two pattern masks are separately exposed but collectively form the desired features or other shapes of the overall layout. The first pattern 110' and the second pattern 120' can be formed with a respective looser pitch P2/P3 as shown in FIG. 6, which is larger than the pitch P1 shown in FIG. 2. The pitch P2 between lines of the first feature 110 and the pitch P3 between lines of the second feature 120 are all larger than the pitch P1, thereby the accuracy of a formed integrated circuit can be improved and the scale of the formed integrated circuit can be reduced. The order of using the first photomask Q1 and the second photomask Q2 to form the first pattern 110' and the second pattern 120' can be changed according to practical requirements. Furthermore, the fifth photomask Q5 may be used to form a fifth pattern 50' in the layer 10, and the fifth pattern 50' will not overlap later formed above patterns.

In this embodiment, the first pattern 110' is inherently parallel to the second pattern 120' and the first pattern 110' and the second pattern 120' are arranged alternately due to being transferred from the first feature 110 and the second feature 120 having the geometric relations. As the first pattern 110' and the second pattern 120' are respectively formed by exposing the first photomask Q1 and the second photomask Q2, a shifting d must occur which affects later formed patterns on or neighboring the first pattern 110' and the second pattern 120'. Dashed lines K represent the locations of the second pattern 120' in an ideal case transferred by the integrated circuit layout design 100.

As shown in FIG. 6 and FIG. 8, the third photomask Q3 is aligned to the first pattern 110' and the third photomask Q3 is used to form a third pattern 130' overlapping the first pattern 110'. Since the third pattern 130' only overlaps the first pattern 110' without overlapping the second pattern 120', the third pattern 130' can overlap the first pattern 110' perfectly through aligning the third photomask Q3 only to the first pattern 110', but not to the second pattern 120'.

Then, as shown in FIG. 6 and FIG. 9, the fourth photomask Q4 is aligned to the second pattern 120' and the fourth photomask Q4 is used to form a fourth pattern 140' overlapping the second pattern 120'. Likewise, since the fourth pattern 140' only overlaps the second pattern 120' without overlapping the first pattern 110', the fourth pattern 140' can overlap the second pattern 120' perfectly through only aligning the fourth photomask Q4 to the second pattern 120', but not to the first pattern 110'. The order of aligning and using the third photomask Q3 and the fourth photomask Q4 to form the third pattern 130' and the fourth pattern 140' can be changed according to practical requirements. It is noted that, the third pattern 130' and the fourth pattern 140' both do not overlap the fifth pattern 50.

It is emphasized that, by applying the method of decomposing layout design for preparing a photomask set printed onto a wafer by photolithography and paired with the alignments of the photomask set of the present invention, the third pattern 130' and the fourth pattern 140' can still overlap the first pattern 110' and the second pattern 120' perfectly even as the shifting d exists between the first pattern 110' and the second pattern 120'.

In this embodiment, the third pattern 130' and the fourth pattern 140' are in a same layer, so that the third pattern 130' and the fourth pattern 140' can be formed by applying double-patterning technology. The accuracy of the formed integrated circuit can be improved and the scale of the formed integrated circuit can be reduced in a similar way as the application of the first pattern 110' and the second pattern 120'. In this embodiment, the third pattern 130' and the fourth pattern 140' are via patterns while the first pattern 110' and the second pattern 120' are interconnect patterns, so the layer 10 being an inter-metal dielectric (IMD). In another embodiment, the first pattern 110' and the second pattern 120' may be polysilicon gate patterns while the third pattern 130' and the fourth pattern 140' may be contact patterns, so the layer 10 is an inter-layer dielectric (ILD), but this depends upon practical requirements.

To summarize, the present invention provides a method of decomposing layout design for preparing a photomask set printed onto a wafer by photolithography, a method of forming a photomask set and a method of fabricating an integrated circuit, which decomposes a layout design according to the overlay relation, wherein printed layers of these features are included in the layout design. These features can be classified into a first feature, a second feature, a third feature and a fourth feature, so that a photomask set constituted of a first photomask including the first feature, a second photomask including the second feature, a third photomask including the third feature, and a fourth photomask including the fourth feature can be formed.

More precisely, these features can be recognized and classified into a first group and a second group, wherein features in one same group overlap each other; and the first group and the second group distinguished by printed layers of a wafer can be further decomposed into the first feature, the second feature, the third feature and the fourth feature, so that multiple patterning processes can be applied to each layer to scale down a formed integrated circuit.

By applying the photomask set, the first photomask can be used to form a first pattern and the second photomask can be used to form a second pattern in a same layer; the third photomask can be aligned only to the first pattern to form a third pattern only overlapping the first pattern; and then the fourth photomask can be aligned only to the second pattern to form a fourth pattern only overlapping the second pattern. The first pattern and the second pattern in the same layer can be formed accurately and the scale of the first pattern and the second pattern can be reduced due to looser pitches achieved by exposing the first photomask and the second photomask, respectively. The third pattern can overlap the first pattern perfectly as it is only aligned to the first pattern while the fourth pattern can overlap the second pattern perfectly as it is only aligned to the second pattern.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of decomposing layout design for preparing a photomask set printed onto a wafer by photolithography, comprising:

obtaining an integrated circuit layout design comprising several features;

recognizing the overlay relation including respective overlay tolerances of these features to classify these features into a first group and a second group by a computer system;

distinguishing these features printed onto different layers of the wafer to decompose the first group into a first feature and a third feature, and the second group into a second feature and a fourth feature, wherein the third feature overlaps the first feature perfectly, and the fourth feature overlaps the second feature perfectly, respectively;

outputting the first feature to a first photomask, the second feature to a second photomask, the third feature to a third photomask and the fourth feature to a fourth photomask; and defining only a minimum pitch with minimum overlay tolerance of these features before the overlay relation of these features are recognized.

2. The method of decomposing layout design according to claim 1, wherein the first feature is parallel to the second feature.

3. The method of decomposing layout design according to claim 1, wherein the first feature and the second feature are arranged alternately.

4. The method of decomposing layout design according to claim 1, wherein the third feature and the fourth feature printed to the wafer are via patterns while the first feature and the second feature printed to the wafer are interconnect patterns.

5. The method of decomposing layout design according to claim 1, wherein the third feature and the fourth feature printed to the wafer are interconnect patterns while the first feature and the second feature printed to the wafer are via patterns.

6. The method of decomposing layout design according to claim 1, wherein the first group does not overlap the second group.

7. The method of decomposing layout design according to claim 1, wherein the features classified into a same group overlap each other.

8. The method of decomposing layout design according to claim 7, wherein the first feature overlaps the third feature, and the second feature overlaps the fourth feature.

9. The method of decomposing layout design according to claim 1, wherein the first feature and the third feature are printed in different layers of the wafer while the second feature and the fourth feature are printed in different layers of the wafer.

10. The method of decomposing layout design according to claim 1, wherein these features are further classified into a third group while recognizing the overlay relation of these features, and the third group is decomposed into a fifth feature while distinguishing these features printed onto different layers of the wafer, and thus the fifth feature is outputted to a fifth photomask.

11. A method of fabricating an integrated circuit, comprising:

using a first photomask to form a first pattern and using a second photomask to form a second pattern in a same layer;

aligning a third photomask to the first pattern to form a third pattern overlapping the first pattern perfectly;

aligning a fourth photomask to the second pattern to form a fourth pattern overlapping the second pattern perfectly, wherein the third pattern and the fourth pattern are in a same layer; and using a fifth photomask to form a fifth pattern in the same layer while using the first photomask to form the first pattern and using the second photomask to form the second pattern, wherein the third pattern and the fourth pattern do not overlap the fifth pattern.

12. The method of fabricating an integrated circuit according to claim 11, wherein the third pattern and the fourth pattern are via patterns while the first pattern and the second pattern are interconnect patterns.

13. The method of fabricating an integrated circuit according to claim 11, wherein the third pattern and the fourth pattern are interconnect patterns while the first pattern and the second pattern are via patterns.

14. The method of fabricating an integrated circuit according to claim 11, wherein the first pattern, the second pattern and the fifth pattern are formed respectively by different photomasks.

15. A method of decomposing layout design for preparing a photomask set printed onto a wafer by photolithography, comprising:

obtaining an integrated circuit layout design comprising several features;

recognizing the overlay relation of these features to classify these features into a first group and a second group by a computer system, wherein respective overlay tolerances of these features in one same group are smaller than the respective overlay tolerances of these features in different groups;

distinguishing these features printed onto different layers of the wafer to decompose the first group into a first feature and a third feature, and the second group into a second feature and a fourth feature, wherein the third feature overlaps the first feature perfectly, and the fourth feature overlaps the second feature perfectly, respectively; and outputting the first feature to a first photomask, the second feature to a second photomask, the third feature to a third photomask and the fourth feature to a fourth photomask.

\* \* \* \* \*